Figure 1:
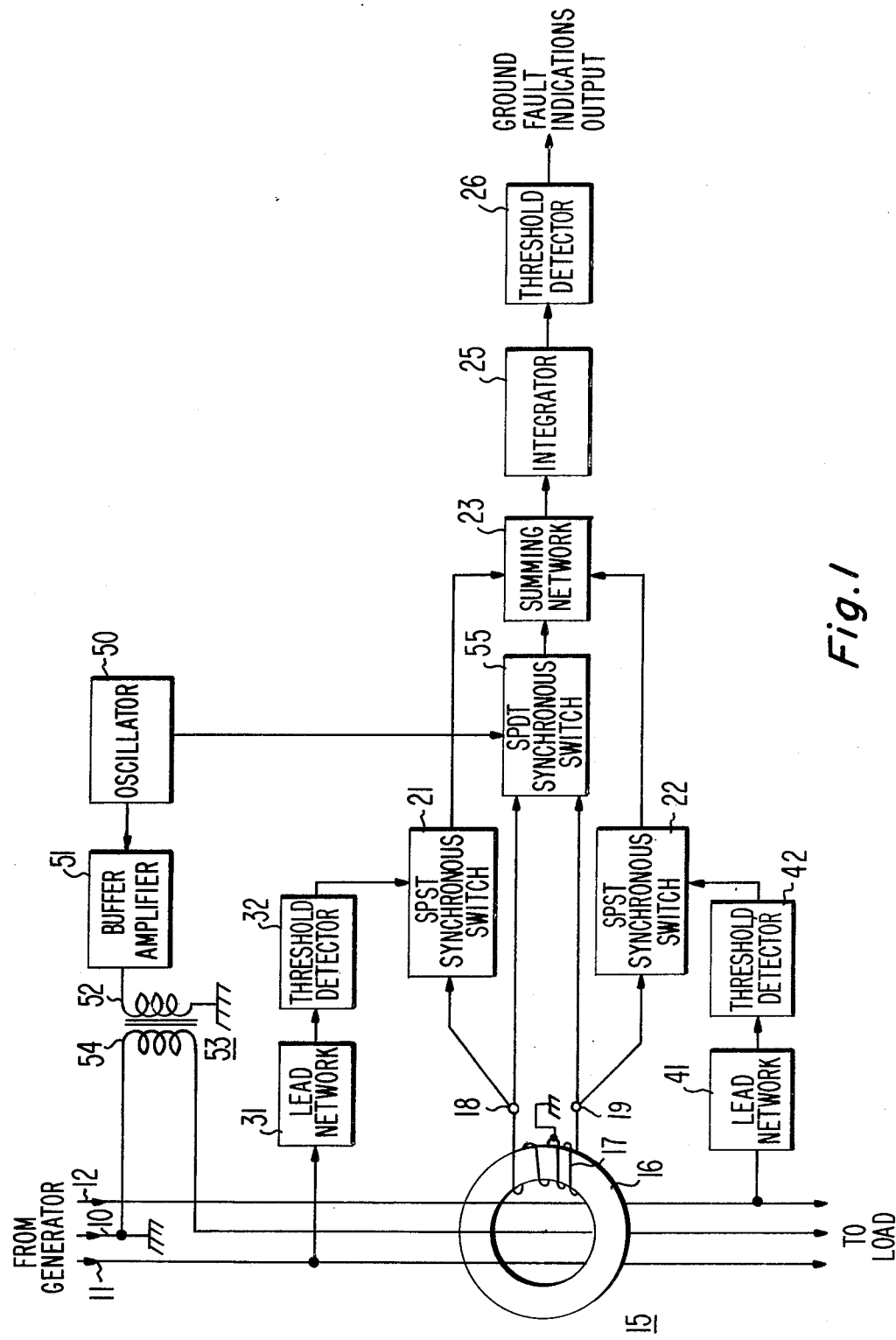

United States Patent [19]

Schade, Jr.

[11] 4,080,641
[45] Mar. 21, 1978

[54] GROUND FAULT DETECTOR

[75] Inventor: Otto Heinrich Schade, Jr., North Caldwell, N.J.

[73] Assignee: RCA Corporation, New York, N.Y.

[21] Appl. No.: 704,323

[22] Filed: Jul. 12, 1976

[51] Int. Cl.² ............................................. H02H 3/28
[52] U.S. Cl. ....................................... 361/46; 361/86; 361/87
[58] Field of Search ...................... 361/45, 46, 44, 78, 361/87, 86

[56] References Cited

U.S. PATENT DOCUMENTS 3,787,709  1/1974  Coe ......................................... 361/45
3,852,642  12/1974  Engel et al. ............................ 361/45
3,953,767  4/1976  Ahmed .................................... 361/44
3,963,963  6/1976  Schade, Jr. ............................. 361/44

Primary Examiner—J D Miller
Assistant Examiner—Patrick R. Salce
Attorney, Agent, or Firm—H. Christoffersen; S. Cohen; A. L. Limberg

[57] ABSTRACT

A ground fault detector which exhibits greater sensitivity to sensing coil current during the initial portions of a-c line voltage half-cycles than during the final portions of those half cycles. This improves its response to resistive ground faults in the presence of unbalanced capacitance to ground conditions of the a-c power lines.

13 Claims, 2 Drawing Figures

GROUND FAULT DETECTOR

The present invention relates to ground fault detector apparatus.

In the typical ground fault detector apparatus, a ground fault is indicated when there is an imbalance between (a) the total current flowing through a set of a-c line conductors from generator to load and (b) the total current flowing back through those conductors from load to generator. Conventionally, this imbalance is sensed by a differential current transformer having the line conductors as primaries and having a secondary winding or "sensing coil". The signal produced by this coil is synchronously detected against a-c line potential and the resulting detected signal integrated. The integrated signal is applied to a threshold detector that provides an output indication whenever the integrated signal exceeds a predetermined threshold level. In ground fault interrupter apparatus, the output indication is used to actuate a relay switch that interrupts continuity through the a-c line conductors.

Ground fault detectors which use time domain filtering in detecting ground faults are used because of their relative insensitivity to sensing coil signal caused by capacitative imbalance between the a-c line conductors and system ground as compared to their sensitivity to sensing coil signal caused by a resistive ground fault.

In some of these ground fault detectors the sensing coil signal is detected on a full-wave basis by means of an electronic synchronous switch that is the functional equivalent of a cross-wired, double-pole-double-throw switch, the switching of which is timed in accordance with a-c line voltage. In others, the sensing coil signal is detected on a half-wave basis by means of an electronic synchronous switch that is the functional equivalent of a single-pole-single-throw switch, the switching of which is timed in accordance with a-c line voltage. One of the shortcomings of these detectors is that when substantially unbalanced, primarily capacitative loading is placed on the a-c line conductors, their sensitivity to resistive ground faults is impaired.

The present invention corrects this shortcoming, which the inventor found to be caused by capacitative imbalance currents being phase-shifted in the differential current transformer and subsequently synchronously detected against a-c line potential to generate an undesired direct component of detected signal. He found the undersired direct component to be of a sense to oppose the direct component of the detected signal caused by a resistive ground fault and to thereby undesirably reduce the amplitude of the integrated signal developed from the detected signal and applied to the threshold detector. The present inventor, upon further analysis, found that this undesired component could be further resolved into two subcomponents. The first subcomponent is generated in initial halves of a-c line half-cycles and the second subcomponent is generated in final halves of a-c line half-cycles. He found that the first and second subcomponents tended respectively to aid and to oppose the direct components of detected signal caused by a resistive ground fault. He also found that because of phase-shifting of the capacitative imbalance currents, the second subcomponent was larger than the first subcomponent, resulting in net opposition to the direct component of detected signal caused by resistive ground fault.

In the present invention, the difference between the total current transmitted from an a-c power source to a load and that returned is detected with a sensitivity that is substantially greater during initial halves of a-c line half-cycles than during final halves of these a-c line half cycles, to cause said first subcomponent to equal or exceed said second subcomponent in amplitude. Any direct component of detected signal attributable to phase-shifted capacitative imbalance currents is thus made of a sense to aid, rather than oppose, the direct component caused by a resistive ground fault, maintaining or even increasing the sensitivity of the detector to resistive ground faults in the presence of capacitative imbalance of the a-c power lines to ground.

Figure 2:
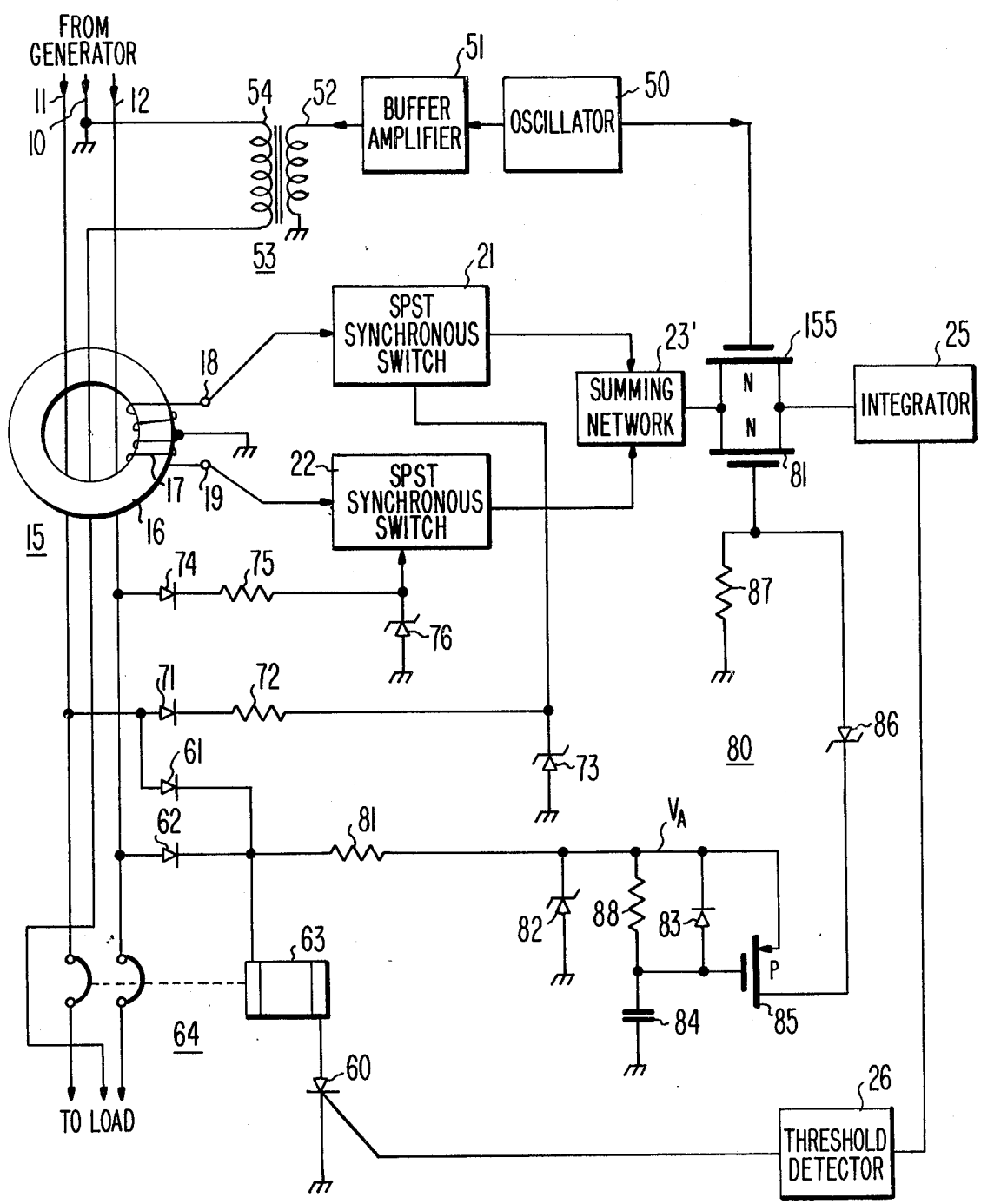

In the drawing:

FIG. 1 is a schematic diagram of a ground fault detector embodying the present invention; and FIG. 2 is a schematic diagram of a ground fault interrupter apparatus including a ground fault detector embodying the present invention.

FIG. 1 shows ground fault detection apparatus for use with a three-wire, grounded-neutral power distribution system. Neutral conductor 10 and line conductors 11 and 12 are arranged as primaries of a differential current sensing transformer 15. Conventionally, this transformer 15 comprises a ferrite core 16 through which conductors 10, 11 and 12 are threaded, and a secondary winding or sensing coil 17 would on the core 16. A sensing coil signal appears between terminals 18 and 19 at the ends of secondary winding 17, responsive to the difference between the total instantaneous current flowing from generator to load via certain of the conductors 10, 11 and 12 and the total instantaneous current returning from load to generator via the remaining of these conductors.

This transformed imbalance signal is applied to the input circuits of a first single-pole-single-throw synchronous electronic switch 21 and of a second single-pole-single-throw synchronous electronic switch 22. Synchronous switches 21 and 22 have their output circuits connected to the input circuits of a summing network 23 for adding their respective output signals together for application to the input circuit of a subsequent integrator 25. Integrator 25, like thoe used in the prior art, is an imperfect integrator for the combined output signals of synchronous switches 21 and 22, as applied from summing network 23. That is, integrator 25 uses energy storage elements that are associated with energy dissipative elements that in time dissipate the stored energy. The imperfectly integrated response at the output circuit of integrator 25 is applied to the input circuit of threshold detector 26. Threshold detector 26 responds to this signal exceeding a predetermined threshold level to generate ground-fault indications at its output circuit.

Synchronous switches 21 and 22, summing network 23, and their interconnections provide a detection means similar to that employed in prior art ground-fault detectors except for the way in which timing signals are applied to the switches 21 and 22 to govern their switching. In prior art ground fault detectors, each of the switches 21 and 22 passes signal during algernate half-cycles of line frequency, and the duration during which they pass signal in each half-cycle is substantially as long as the full duration of the half-cycle. The out-of-phase timing signals for the switches 21 and 22 are quite simply generated in the prior art by half-wave rectification of the out-of-phase neutral-to-line potentials appearing on conductors 11 and 12, respectively, which rectification may be followed by clipping and limiting to avoid the application of over-large timing signals to the swiches 21 and 22. Electronic switches 21 and 22 advantageously take the form of recurrently energized amplifiers, to provide signal gain between the sensing coil 17 and integrator 25.

In the FIG. 1 ground fault detector, the switches 21 and 22 are activated during alternative half-cycles of line voltage, but these switches are conductive during each half-cycle only for a time appreciably less than the full duration of the half-cycle--say, for 7/16 to ⅜ of a half cycle. Further, the times in which the synchronous switches pass signal are arranged to be early in each half-cycle of line voltage.

This is done as follows. The timing signal for causing switch 21 to pass signal is generated by advancing the phase of the neutral-to-line voltage appearing on conductor 11 by a few degrees by passing it through a lead network 31, then clipping the advanced-phase signal at such a level in threshold detector 32 as to provide a timing signal for a portion of the wave appreciably shorter than a half-cycle. Timing signal for switch 22 is generated similarly in lead network 41 and threshold detector 42, proceeding from the neutral-to-line voltage on conductor 12 rather than that on conductor 11.

In the FIG. 1 ground detection apparatus, then, the detection means comprising elements 21, 22, 23 is still sensitive to sensing coil signal during the beginning and middle portions of each half-cycle of line potential, but is insensitive to sensing coil current during the final portion of each half-cycle. Detection sensitivity is maintained during the middle portions of each half-cycle of line potential when sensing coil signal due to a resistive fault is at its peak, so the component of integrated signal caused by imbalance current due to a resistive fault is only slightly reduced. Detector sensitivity is maintained during the early portion of each half-cycle of line potential when sensing coil signal due to capacitive imbalance is close to peak in a sense that tends to give rise to a first subcomponent of detected signal that additively combines with the component due to resistive fault. Detector sensitivity is reduced substantially to zero in the late portion of each half-cycle of line potential, however, when sensing coil signal due to capacitative imbalance is close to peak in a sense that tends to give rise to an unwanted second subcomponent of detected signal that subtractively combines with a component due to resistive fault. This forestalls the detected signal having a net direct compnent due to capacitative imbalance that is of a sense to counteract the component due to a resistive ground fault. The other integrated detected signal applied to detector 26 provides output indications for the less severe ground faults, as desired.

The ground fault detector of FIG. 1 provides indications of ground faults occurring on neutral conductor 10 as well as providing indications of ground faults occurring on either of line conductors 11 and 12. To do this, an oscillator 50 supplies a signal at a frequency many times higher than line frequency (e.g., 8kHz, if line frequency be 60Hz) coupled by means, usually including a buffer amplifier 51, to the primary winding 52 of a transformer 53. The secondary winding 54 of transformer 53 is inserted in neutral conductor 10 on the load side of its connection to ground so as to inject oscillations into this conductor. When a ground fault occurs on neutral conductor 10 on the load side of both winding 54 and core 16, 8kHz current will flow in conductor 10 so as to induce an 8kHz response between terminals 18 and 19 of sensing coil 17. This 8kHz response is synchronously detected at 8kHz rate by a synchronous switch 55 to provide further detected signal for summation with detected signal from switches 21 and 22 in summing network 23. Electronic switch 55 is shown as a single-pole-double-throw type, the signal it supplies to summing network 23 being alternately responsive to sensing coil signal of opposite polarities appearing at terminals 18 and 19. However, switch 55 could be replaced by a switch of single-pole-single-throw type simply recurrently responsive to sensing coil signal of one polarity, and supplying its response to summing network 23.

The FIG. 1 ground fault detector can be adapted for use with a two-wire power distribution system having conductors corresponding to 10, 11 only. Elements 22, 23, 41 and 42 are dispensed with and the synchrnous detection means is modified to consist of switch 21 having is output circuit direct coupled to the input circuit of integrator 25. Detector sensitivity is nil during one of the sets of alternate half-cycles of line potential, and during each of the other sets of alternate half-cycles detector sensitivity is reduced in the late portion of the half-cycle as compared to sensitivity during the early and mid portions of the half-cycle.

Rather than reducing the sensitivity of the ground fault detection apparatus during the final portions of the half-cycles of line potential, one may boost its sensitivity during the initial portions of the half-cycles of line potential. This is the more advantageous alternative to pursue in ground fault interrupter apparatus. During sever ground fault conditions, where the imbalance between the currents in each direction in conductors 10, 11, 12 reaches to levels (e.g., 100 amperes) sufficient to saturate core 16, sensing signal no longer appears between terminals 18 and 19. It is desirable, therefore, to have increased ground fault detector sensitivity during the outset of each half-cycle of line potential so that sufficient energy can be coupled into integrator 25 during that time, to cause the integrated signal applied to the input of threshold detector 26 to be sufficiently large to generate ground fault indication at the output of threshold detector 26. This indication is then used to actuate the relay switch used for opening the line conductors.

FIG. 2 shows representative ground fault detector apparatus wherein detection sensitivity is boosted during the initial portions of half-cycles of line potential. This detector apparatus is included in ground fault interrupter apparatus wherein ground fault indications from threshold detector 26 are applied to the gate electrode of a semiconductor controlled rectifier 60 to trigger it into conduction. This completes a path for full wave rectified a-c to flow via diodes 61 and 62 from line conductors 11 and 12, and through the coil 63 of relay switch 64. Energization of the coil 63 of relay switch 64 causes the switch to interrupt conduction through a-c line conductors 11 and 12.

The ground fault detector portion of the interrupter apparatus also differs from the FIG. 1 ground fault detector in that the synchronous switch used in detecting resistive ground faults on neutral conductor 10 is a field effect transistor 155 connected as a transmission gate and is not operated in parallel with the synchonous switches 21 and 22 but rather in cascade after them. This advantageous to do for the following reason. As pointed out by A.A.A. Ahmed in U.S. Pat. No.

3,953,767 issued Apr. 27, 1976, and entitled "Ground Fault Detection Apparatus" synchronous switches 21 and 22 preferably are of a type such that their input circuits present short circuit loading to sensing coil 17, since this removes variations in ground fault detection sensitivity attributable to variations in the permeability of the material of core 16. Synchronous switches of this type tend towards complexity. Cascading the synchronous switch used for detection of ground faults on neutral conductor 10 after synchronous switches 21 and 22 permits it to be a relatively high input impedance type of relatively simple construction—e.g., the simple transmission gate provided by the single insulated gate field effect transistor 155, shown as being an n-channel type FET.

Summing networks 23' is a two-input modification of summing network 23. Synchronous switch 21 couples signal from terminal 18 to a first input of summing network 23' when a-c line potential from line conductor 11 is positive and synchronous switch 22 couples signal from terminal 19 to a second input of summing network 23' when a-c line potential from line conductor 12 is positive. As known from the Ahmed patent, elements 61–66 can generate timing signals for application to synchronous switches 21 and 22 to carry this out.

The synchronous switch provided by FET 155 chops the detected signal provided from summing network 23' which, on average, reduces the signal energy made available to integrator 25 for integration as compared to the case where the detected signal from summing network 23' is applied directly to integrator 25. Circuitry 80, includng an N-channel FET 81, connected as a transmission gate, is transmissive only at the outset of each half-cycle of a-c line potential. At those times, the conduction of FET 81 applies the detected signal available at the output of summing network 23' to the input of integrator 25, by-passing cut-off FET 155. This boosts the sensitivity with which a-c line frequency components of sensing coil signal are detected during the initial portions of half-cycles of a-c line potential, by a factor inversely related to the mark-to-space ratio of the signals applied to the gate electrode of FET 155 to cause it to be conductive.

In a ground fault interrupter system using a 1:2 mark-to-space ratio of conduction to non-comduction through FET 155, closing switch 81 for $\pi/8$ radians of line frequency at outsets of line half-cycles causes the threshold level at which resistive ground faults are just detected to remain substantially constant despite the degree of capacitance imbalance between ground on a-c line conductors 11 and 12. Keeping switch 81 closed for longer periods results in such capacitive imbalance lowering the threshold level at which resistive ground faults are just detected, which operation may be sought to secure additional protection in case of severe ground faults substantially if capacitive character.

The potential applied to the gate electrode of FET 81 to control its conduction is generated as follows. Full wave rectified a-c line potential appearing at the common cathode connection of diodes 61 and 62 is clipped by the L-network comprising series arm resistor 81 and shunt-leg avalanche diode 82 to provide a potential $v_a$ which falls to zero at zero crossings of a-c line voltage and which is otherwise positive-valued. At a zero crossing of a-c line potential diode 83 is forward-biased by potential due to stored charge on capacitor 84, which provides a path for dissipating the storage charge, and $v_a$ is zero-valued. As $v_a$ swings positive, diode 83 is reverse-biased due to the tendency of capacitor 84 to hold the gate potential of the gate of FET 85 at ground potential, which blocks the flow of charge through diode 83. FET 85 is of p-channel enhancement-mode type.

The positive-swinging potential $v_a$ appears at its source electrode, while capacitor 84 tends to hold its gate potential at ground, so FET 85 is biased into conduction, clamping its drain electrode to $v_a$. So $v_2$ reduced by the offset voltage across avalanche diode 86 (diode 86 being reversed-biased into avalanche by the flow of the drain current of FET 85 through it and resistor 87 to ground) is applied to the gate electrode of n-channel FET 81 to render FET 81 conductive. As the half-cycle of a-c line potential progresses, $v_a$ causes charge to flow through resistor 88 and accumulate on capacitor 84. In accordance with Coulomb's Law there is a tendency towards rise in the potential on the plate of capacitor 84 to which the gate electrode of FET 85 is connected. This rise in gate potential of FET 85 becomes sufficient after a fraction of a half-cycle of a-c line frequency that the difference between the source potential of the FET 85, $v_a$, and its gate potential is less than the threshold potential required to maintain the channel of FET 85 conductive. Avalanche diode 86 is no longer biased into avalanche and resistor 87 pulls down the gate potential of FET 81 to ground potential, ending conduction through the channel of FET 81.

Those skilled in the art of time-domain filtering and informed by the present disclosure will realize there are many alternatives in design for obtaining the desired time domain filtering used in implementing the present invention, and the scope of the invention as expressed in its broadest claims should be considered to include those variants. For example, the FIG. 2 apparatus might be modified so the output of the summing network 23' would be selectively coupled to the input of the integrator 25 by a single transmission gate, the transmission through which gate is controlled in response to a logical OR circuit combining the potential developed across resistor 87 and the oscillator potential supplied by oscillator 50.

However, the use of the channel of FET 81 to selectively by-pass the channel of FET 155 provides another practical advantage. In event of failure of oscillator 50 to oscillate in such a manner that FET 155 is inoperative to provide connection of the output of summing network 23' to the input of integrator 25, the recurrent conduction of FET 81 completes that connection for a portion of each half cycle of line potential. Accordingly, capability for detecting ground faults on line conductors, which present greater hazard than ground faults on neutral conductors, is preserved despite failure of oscillator 50. The time required for response to ground faults on the line conductors will be lengthened, however, should oscillator 50 fail.

The FIG. 2 ground fault interrupter can be modified as follows for two-wire operation, omitting conductor 12. Elements 22, 74, 75, 76, 23', 61, 62, 81 and 82 are omitted; the output of synchronous switch 21 is applied instead of the output of summing network 23' to the channel of FET 155; relay coil 63 is connected between the cathode of diode 71 and anode of controlled rectifier 60; and $V_A$ is supplied from the cathode of avalanche diode 73.

What is claimed is:

1. In a ground fault detector for determining the presence of a resistive ground fault occurring on certain of a plurality of a-c power line conductors, a first of which conductors is grounded at a point and each other of which may exhibit a respective capacitance to ground; which ground fault detector includes a differential current transformer having primaries, each for inclusion in a respective one of said plurality of a-c power line conductors, and having a secondary winding or sensing coil for providing a sensing coil signal exhibiting fluctuations responsive to the instantaneous flows of current through said primaries in each direction being imbalanced; which ground fault detector includes time domain filtering means providing response to said sensing coil signal during substantially the complete durations of certain half-cycles of the a-c line potential $V_{a-c}$ from one of said power line conductors; for the improvement wherein said time domain filtering means comprises means exhibiting a response of substantially greater sensitivity to said sensing coil signal during the initial portion of each of said certain half-cycles of $V_{a-c}$ than during its final portion, thereby to prevent the undesirable characteristic that the sensitivity of said ground fault detector to a resistive ground fault is reduced for imbalanced capacitance-to-ground conditions on said power line conductors.

2. An improved ground fault detector as set forth in claim 1 wherein said means exhibiting a response of substantially greater sensitivity to said sensing coil signal during the initial portion of each of said certain half of $V_{a-c}$ than during its final portion comprises:
means exhibiting a response to said sensing coil signal for initial and mid portions of said each of said certain half-cycles of $V_{a-c}$, but not for its final portion.

3. An improved ground fault detector as set forth in claim 1 wherein said means for exhibiting a response of substantially greater sensitivity to said sensing coil during the initial portion of each of certain half-cycles of $V_{a-c}$ than during its final portion comprises:
means exhibiting a response to said sensing coil signal of greater sensitivity to initial portions of each of certain half-cycles of $V_{a-c}$ than for its mid and final portions.

4. A ground fault detector for determining the presence of a resistive ground fault occurring on certain of a plurality of a-c power line conductors, a first of which conductors is grounded at a point and each other of which may exhibit a respective capacitance to ground, said ground fault detector comprising:
a differential current transformer having primaries each for inclusion in a respective one of said plurality of a-c power line conductors, and having a secondary winding or sensing coil for providing a sensing coil signal exhibiting fluctuations resonsive to the instantaneous flows of current through said primaries in each direction being imbalanced;
means responsive to alternate half-cycles of the a-c line potential $V_{2-c}$ appearing on the second of said a-c power line conductors for developing a timing signal during all the first half of each alternate half-cycle of $V_{a-c}$ and all but the final portion of the last half of the alternate half-cycle of $V_{a-c}$;
a synchronous switch having an input circuit, to which said sensing coil is coupled, and having an output circuit to which its input circuit is selectively coupled responsive to said timing signal, thereby to generate at least a portion of a detected signal at its output circuit;
intregratng means for imperfectly integrating said detected signal to provide an integrated signal; and
threshold detector means for providing indications of a resistive ground fault whenever said integrated signal exceeds a threshold level.

5. A ground fault detector for determining the presence of a resistive ground fault occurring on certain of a plurality of a-c power line conductors, a first of which conductors is grounded at a point and each other of which may exhibit a respective capacitance to ground, said ground fault detector comprising:
a differential current transformer having primaries, each for inclusion in a respective one of said plurality of a-c power line conductors, and having a secondary winding or sensing coil for providing a sensing coil signal exhibiting fluctuations responsive to the instantaneous flows of current through said primaries in each direction being imbalanced;
a first synchronous switch having an input circuit for receiving signal to be synchronously detected to which said sensing coil is coupled, and having an output circuit to which its input circuit is selectively coupled responsive to alternate half-cycles of the a-c potential $V_{a-c}$ appearing on the second of said a-c power line conductors, thereby to generate at least a portion of a detected signal at its output circuit;
integrating means for imperfectly integrating signal applied to its input circuit to provide an integrated signal;
threshold detector means for providing indications of a resistive ground fault whenever said integrated signal exceeds a theshold level; and
time-domain filtering means for selectively coupling the signal from the output circuit of said first synchronous switch to the input circuit of said integrating means including
means responsive to the a-c line potential $V_{a-c}$ for increasing the degree of coupling between the output circuit of said first synchronous switch and the input circuit of said integrating means during the initial portions of half-cycles of $V_{a-c}$ in which said first synchronous switch has its inpur circuit coupled to its output circuit as compared with the middle and final portions of those half-cycles, thereby to prevent the undesirable characteristic that the sensitivity of said ground fault detector to a resistive ground fault is reduced for imbalanced capacitance-to-ground conditions on said a-c power line conductors.

6. A ground fault detector as set forth in claim 5 having:
a local oscillator for generating oscillations of a frequency substantially higher than $V_{a-c}$;
means for injecting said oscillations into said first a-c power line conductor; and
a second synchronous switch included in said time-domain filtering means, said synchronous switch being responsive to excursions in one direction of said oscillations for coupling the signal from the output circuit of said first synchronous switch to the input of said integrating means.

7. A ground fault detector as set forth in claim 6 wherein said time-domain filtering means includes:
a third synchronous switch, responsive to the initial portions of the half-cycles of $V_{a-c}$ in which said first synchronous switch has its input circuit coupled to its output circuit, for coupling the signal from the output circuit of said first synchronous switch to the input circuit of said integrating means, thereby providing said means for increasing the degree of coupling between the output circuit of said first synchronous switch and the input circuit of said integrating means during the initial portions of the half-cycles of $V_{a-c}$ in which said first synchronous switch has its input circuit coupled to its output circuit.

8. A ground fault detector for determining the presence of a resistive ground fault occurring on certain of a plurality of a-c power line conductors, a first of which conductors is grounded at a point and each other of which may exhibit a resistive capacitance to ground, said ground fault detector comprising:

a differential current transformer having primaries each for inclusion in a respective one of said plurality of a-c power line conductors, and having a secondary winding or sensing coil for providing a sensing coil signal exhibiting fluctuations responsive to the instantaneous flows of current through said primaries in each directin being imbalanced;

a first synchronous switch having an input circuit for receiving signal to be synchronously detected to which said sensing coil is coupled, and having an output circuit to which its input circuit is selectively coupled responsive to alternate half-cycles of a-c line potential $V_{a-c}$ appearing on the second of said a-c power line conductors, thereby to generate a first portion of a detected signal at the output of said first synchronous switch;

a second synchrohous switch having an input circuit for receiving signal to be synchronously detected to which said sensing coil is coupled, and having an output circuit to which its input circuit is selectively coupled substantially in opposite phase to the selective coupling of the input circuit of said first synchronous switch to its output circuit, thereby to generate a second portion of a detected signal at the output circuit of said second synchronous switch;

signal combining means with input circuits and an output circuit, said signal combining means for additively combining said first and said second portions of said detected signal as applied to respective input circuits of said signal summing network and supplying said detected signal at the output circuit of said signal summing network;

integrating means for imperfectly integrating signal applied to its circuit to provide an integrated signal;

threshold detector means for providing indications of a resistive ground fault whenever said integrated signal exceeds a threshold level; and means for selectively coupling the output circuit of said signal combining means to the input circuit of said integrating means including means responsive to the a-c line potential $V_{a-c}$ for increasing the degree of coupling between the output circuit of said signal combining means and the input circuit of said integrating means during the initial portions of half-cycles of $V_{a-c}$ as compared with during the middle and final portions of those half-cycles, thereby to prevent the undesirable characteristics that the sensitivity of said ground fault detector to a resistive ground fault is reduced for unbalanced capacitance-to-ground conditions on said a-c power line conductors.

9. A ground fault detector as set forth in claim 6 having:

a local oscillator for generating oscillations of a frequency substantially higher than $V_{a-c}$;

means for injecting said oscillations into said first a-c power line conductor; and a third synchronous switch included in said time-domain filtering means responsive to excursions in one direction of said oscillations to couple the signal from the output circuit of said signal combining means to the input of said integrating means.

10. A ground fault detector as set forth in claim 9 wherein said time domain filtering means includes:

a fourth synchronous switch responsive to the initial portions of half-cycles of $V_{a-c}$ to couple the signal from the output circuit of said signal summing network means to the input circuit of said integrating means for providing said means for increasing the degree of coupling between the output circuit of said signal combining means during the initial portions of half-cycles of $V_{a-c}$.

11. In the method of ground fault detection in which the current transmitted from an a-c power source to a load is compared with that returned to the source from the load during half periods of the a-c line potential, the improvement comprising the step of:

sensing the difference between the transmitted and returned currents with substantially greater sensitivity during the initial than during the final portions of said half periods of a-c line potential.

12. The method set forth in claim 11 wherein the step of sensing the difference between the transmitted and returned currents with substantially greater sensitivity during the initial than during the final portions of said half periods of a-c line potential comprises the step of:

sensing the difference between the transmitted and returned currents only during the initial and mid portions of said half periods of a-c line potential.

13. The method set forth in claim 11 wherein the step of sensing the difference between the transmited and returned currents with substantially greater sensitivity during the initial than during final portions of said half periods of a-c line potential comprises the steps of:

sensing the difference between the transmitted and returned currents during the mid and final portions of said half cycle periods of a-c line potential;

sensing difference between the transmitted and returned currents with increased sensitivity during the initial portions of said half periods of a-c line potential compared with the mid and final portions of said half periods of a-c line potential.

* * * * *

UNITED STATES PATENT OFFICE
CERTIFICATE OF CORRECTION

Page 1 of 3

PATENT NO. : 4,080,641

DATED : March 21, 1978

INVENTOR(S) : Otto Heinrich Schade, Jr.

It is certified that error appears in the above-identified patent and that said Letters Patent are hereby corrected as shown below:

Col. 1, line 50, change "undersired" to -- undesired --.

Col. 2, line 44, change "thoe" to -- those --

Col. 2, line 65, change "of the" to -- of that --.

Col. 3, line 50, change "compnent" to -- component --.

Col. 4, line 18, change "synchrnous" to -- synchronous --.

Col. 4, line 33, change "sever" to -- severe --.

Col. 4, line 65, change "synchonous" to -- synchronous --.

Col. 4, line 67, after "This" add -- is --.

UNITED STATES PATENT OFFICE
CERTIFICATE OF CORRECTION

PATENT NO. : 4,080,641             Page 2 of 3

DATED : March 21, 1978

INVENTOR(S) : Otto Heinrich Schade, Jr.

It is certified that error appears in the above-identified patent and that said Letters Patent are hereby corrected as shown below:

Col. 5, line 16,    change "networks" to -- network --.

Col. 5, line 32,    change "includng" to -- including --.

Col. 5, line 36,    change "lale" to -- lable --.

Col. 5, line 45,    change "non-comduction" to -- non-conduction --.

Col. 5, line 53,    underscore the word "<u>lowering</u>".

Col. 6, line 8,    change "$v_2$" to -- $v_a$ --.

Col. 7, line 52,    change "resonsive" to -- responsive --.

Col. 7, line 56,    change "$V_{2-c}$" to -- $V_{a-c}$ --.

Col. 7, line 60,    change "the" to -- each --.

Col. 7, line 67,    change "intregratng" to -- integrating --.

UNITED STATES PATENT OFFICE
CERTIFICATE OF CORRECTION

PATENT NO. : 4,080,641

DATED : March 21, 1978

INVENTOR(S): Otto Heinrich Schade, Jr.

It is certified that error appears in the above-identified patent and that said Letters Patent are hereby corrected as shown below:

Col. 8, line 41, change "inpur" to -- input --.

Col. 9, line 30, change "synchrohous" to -- synchronous --.

Col. 9, line 48, after "its" insert -- input --.

Col. 10, line 49, after "during" add -- the --.

Signed and Sealed this

Eighth Day of August 1978

[SEAL]

Attest:

RUTH C. MASON
Attesting Officer

DONALD W. BANNER
Commissioner of Patents and Trademarks